US010782422B2

(12) United States Patent
Liang et al.

(10) Patent No.: US 10,782,422 B2
(45) Date of Patent: Sep. 22, 2020

(54) DOSE RATE MEASUREMENT SYSTEMS AND METHODS

(71) Applicant: FLIR Detection, Inc., Stillwater, OK (US)

(72) Inventors: Felix Liang, Oak Ridge, TN (US); Hartmut Brands, Oak Ridge, TN (US); Kyle Hawes, Knoxville, TN (US); Leslie D. Hoy, Knoxville, TN (US); Jeffrey Robert Preston, Knoxville, TN (US)

(73) Assignee: FLIR Detection, Inc., Stillwater, OK (US)

( * ) Notice: Subject to any disclaimer, the term of this patent is extended or adjusted under 35 U.S.C. 154(b) by 0 days.

(21) Appl. No.: 15/953,105

(22) Filed: Apr. 13, 2018

(65) Prior Publication Data
US 2018/0267174 A1    Sep. 20, 2018

Related U.S. Application Data

(63) Continuation of application No. PCT/US2016/054995, filed on Sep. 30, 2016.
(Continued)

(51) Int. Cl.
*G01T 1/16* (2006.01)
*G01T 1/17* (2006.01)
(Continued)

(52) U.S. Cl.
CPC ............. *G01T 1/1603* (2013.01); *G01T 1/02* (2013.01); *G01T 1/023* (2013.01); *G01T 1/026* (2013.01);
(Continued)

(58) Field of Classification Search
CPC ......... G01T 1/1603; G01T 1/02; G01T 1/023; G01T 1/026; G01T 1/171; G01T 1/175;
(Continued)

(56) References Cited

U.S. PATENT DOCUMENTS 3,646,347 A * 2/1972 Farmer ..................... G01T 1/02
250/336.1
8,212,221 B2 7/2012 Stein et al.
(Continued)

FOREIGN PATENT DOCUMENTS

EP 3026463 6/2016
JP H10 186041 7/1998
(Continued)

OTHER PUBLICATIONS

Isobe (JP 5043728 B2 published Oct. 10, 2012), English Translation, Google Patents, obtained Sep. 27, 2018 (Year: 2018).*
(Continued)

*Primary Examiner* — David P Porta
*Assistant Examiner* — Jeremy S Valentiner
(74) *Attorney, Agent, or Firm* — Haynes and Boone, LLP

(57) ABSTRACT

Techniques are disclosed for systems and methods to detect radiation accurately, and particularly in a highly radioactive environment. A system includes a detector module for a radiation detector and a parallel signal analyzer configured to receive radiation detection event signals from the detector module and provide a spectroscopy output and a dose rate output. The parallel signal analyzer may be configured to analyze the radiation detection event signals in parallel in first and second analysis channels according to respective first and second measurement times and determine the spectroscopy output and the dose rate output based on radiation detection event energies determined according to the respective first and second measurement times.

20 Claims, 8 Drawing Sheets

Related U.S. Application Data

(60) Provisional application No. 62/255,332, filed on Nov. 13, 2015.

(51) Int. Cl.
- *G01T 1/02* (2006.01)
- *G01T 1/18* (2006.01)
- *G01T 1/208* (2006.01)
- *G01T 1/175* (2006.01)
- *G01T 1/202* (2006.01)
- *G01T 1/205* (2006.01)
- *G01T 1/24* (2006.01)

(52) U.S. Cl.
CPC .............. *G01T 1/171* (2013.01); *G01T 1/175* (2013.01); *G01T 1/18* (2013.01); *G01T 1/205* (2013.01); *G01T 1/208* (2013.01); *G01T 1/2023* (2013.01); *G01T 1/247* (2013.01); *G01T 1/248* (2013.01)

(58) Field of Classification Search
CPC ......... G01T 1/18; G01T 1/2023; G01T 1/205; G01T 1/208; G01T 1/247; G01T 1/248
See application file for complete search history.

(56) References Cited

U.S. PATENT DOCUMENTS

| | | | |
|---|---|---|---|
| 10,031,239 B2* | 7/2018 | Fontbonne | G01T 1/02 |
| 2007/0075251 A1* | 4/2007 | Doughty | G01T 1/247 |
| | | | 250/370.01 |
| 2011/0036988 A1* | 2/2011 | Campbell | G01T 1/026 |
| | | | 250/370.07 |
| 2011/0251828 A1* | 10/2011 | Scoullar | G01V 1/28 |
| | | | 702/189 |
| 2016/0081637 A1* | 3/2016 | Noshi | A61B 6/032 |
| | | | 378/5 |
| 2017/0090041 A1* | 3/2017 | Yokoyama | G01T 1/023 |

FOREIGN PATENT DOCUMENTS

| | | | | |
|---|---|---|---|---|
| JP | 2003/194948 | | 7/2003 | |
| JP | 4131912 B2 * | | 8/2008 | ............... G01T 1/02 |
| JP | 2009/229127 | | 10/2009 | |
| JP | 5043728 B2 * | | 10/2012 | ............... G01T 1/171 |
| WO | WO 2015/012191 | | 1/2015 | |
| WO | WO-2015081134 A2 * | | 6/2015 | ............... G01T 1/02 |

OTHER PUBLICATIONS

Izumi et al. (JP 4131912 B2 published Aug. 13, 2008), English Translation, Google Patents, obtained Sep. 27, 2018 (Year: 2018).*

* cited by examiner

DOSE RATE MEASUREMENT SYSTEMS AND METHODS

CROSS-REFERENCE TO RELATED APPLICATIONS

This application is a continuation of International Patent Application No. PCT/US2016/054995 filed Sep. 30, 2016 and entitled "DOSE RATE MEASUREMENT SYSTEMS AND METHODS," which is hereby incorporated by reference in its entirety.

International Patent Application No. PCT/US2016/054995 filed Sep. 30, 2016 claims priority to and the benefit of U.S. Provisional Patent Application No. 62/255,332 filed Nov. 13, 2015 and entitled "DOSE RATE MEASUREMENT SYSTEMS AND METHODS," which is hereby incorporated by reference in its entirety.

This application is related to U.S. patent application Ser. No. 15/164,775 filed May 25, 2016 now U.S. Pat. No. 9,835,735 B2 which issued Dec. 5, 2017 and entitled "SiPM-BASED RADIATION DETECTION SYSTEMS AND METHODS," which is a continuation of International Patent Application No. PCT/US2014/067489 filed Nov. 25, 2014 and entitled "SiPM-BASED RADIATION DETECTION SYSTEMS AND METHODS," which claims the benefit of and priority to U.S. Provisional Patent Application No. 61/909,311 filed Nov. 26, 2013 and entitled "SiPM-BASED RADIATION DETECTION SYSTEMS AND METHODS," all of which are hereby incorporated by reference in their entirety.

TECHNICAL FIELD

One or more embodiments of the invention relate generally to radiation detection systems and more particularly, for example, to systems and methods for detecting dose rate in radioactive environments.

BACKGROUND

Radiation detectors have traditionally been used to measure the energy and count rate of detected radiation in order to identify sources of radiation or to calculate dose rate. For example, conventional radiation detectors typically use a scintillator coupled to a photomultiplier to convert incident radiation to electrical pulses, and the energy of the incident radiation can be determined from characteristics of the pulses. The energy of the incident radiation can be used to identify its source, and a counting of events, combined with their specific energies, can be used to determine a dose rate.

Each pulse has a characteristic shape that can have a length as long as multiple microseconds, and so each measurement conventionally takes just as long. During a pulse measurement process, conventional radiation detectors ignore subsequent signals until the present measurement is complete, and so fewer events are processed, thereby resulting in instrumental dead time for the radiation detector. Such dead time either produces inaccurate energy and/or dose rate measurements or requires prolonged exposure to the radiation environment to increase the statistical accuracy of one or the other measurements, neither circumstance being desirable, especially in highly radioactive environments. Thus, there is a need for an improved methodology for detecting radiation that reduces instrumental dead time, particularly when energy detection, source identification, and/or dose rate are determined in highly radioactive environments.

SUMMARY

Techniques are disclosed for systems and methods to detect radiation accurately, and particularly in a highly radioactive environment. In one embodiment, a system includes a detector module for a radiation detector, where the detector module is configured to provide radiation detection event signals corresponding to incident ionizing radiation; and a parallel signal analyzer configured to receive the radiation detection event signals and provide a spectroscopy output and a dose rate output. The parallel signal analyzer may be configured to analyze the radiation detection event signals in parallel in first and second analysis channels according to respective first and second measurement times; and determine the spectroscopy output and the dose rate output based on radiation detection event energies determined according to the respective first and second measurement times.

In another embodiment, a method includes receiving radiation detection event signals corresponding to incident ionizing radiation from a detector module for a radiation detector; analyzing the radiation detection event signals in parallel in first and second analysis channels according to respective first and second measurement times; and determining a spectroscopy output and a dose rate output based on radiation detection event energies determined according to the respective first and second measurement times.

In a further embodiment, a radiation detector module includes an enclosure; a radiation sensor separated from the enclosure by one or more damping inserts; readout electronics configured to provide radiation detection event signals corresponding to incident ionizing radiation in the radiation sensor; and a cap comprising an internal interface configured to couple to the readout electronics and an external interface configured to couple to a radiation detector, where the cap is configured to hermetically seal the radiation sensor within the enclosure.

In another embodiment, a method includes providing an enclosure; placing a radiation sensor and readout electronics within the enclosure, where the radiation sensor is separated from the enclosure by one or more damping inserts, and where the readout electronics are configured to provide radiation detection event signals corresponding to incident ionizing radiation in the radiation sensor; and hermetically sealing the radiation sensor within the enclosure using a cap to form a radiation detector module, where the cap comprises an internal interface configured to couple to the readout electronics and an external interface configured to couple to a radiation detector.

The scope of the invention is defined by the claims, which are incorporated into this section by reference. A more complete understanding of embodiments of the invention will be afforded to those skilled in the art, as well as a realization of additional advantages thereof, by a consideration of the following detailed description of one or more embodiments. Reference will be made to the appended sheets of drawings that will first be described briefly.

BRIEF DESCRIPTION OF THE DRAWINGS

Embodiments of the invention and their advantages are best understood by referring to the detailed description that follows. It should be appreciated that like reference numerals are used to identify like elements illustrated in one or more of the figures.

DETAILED DESCRIPTION

Figure 1:
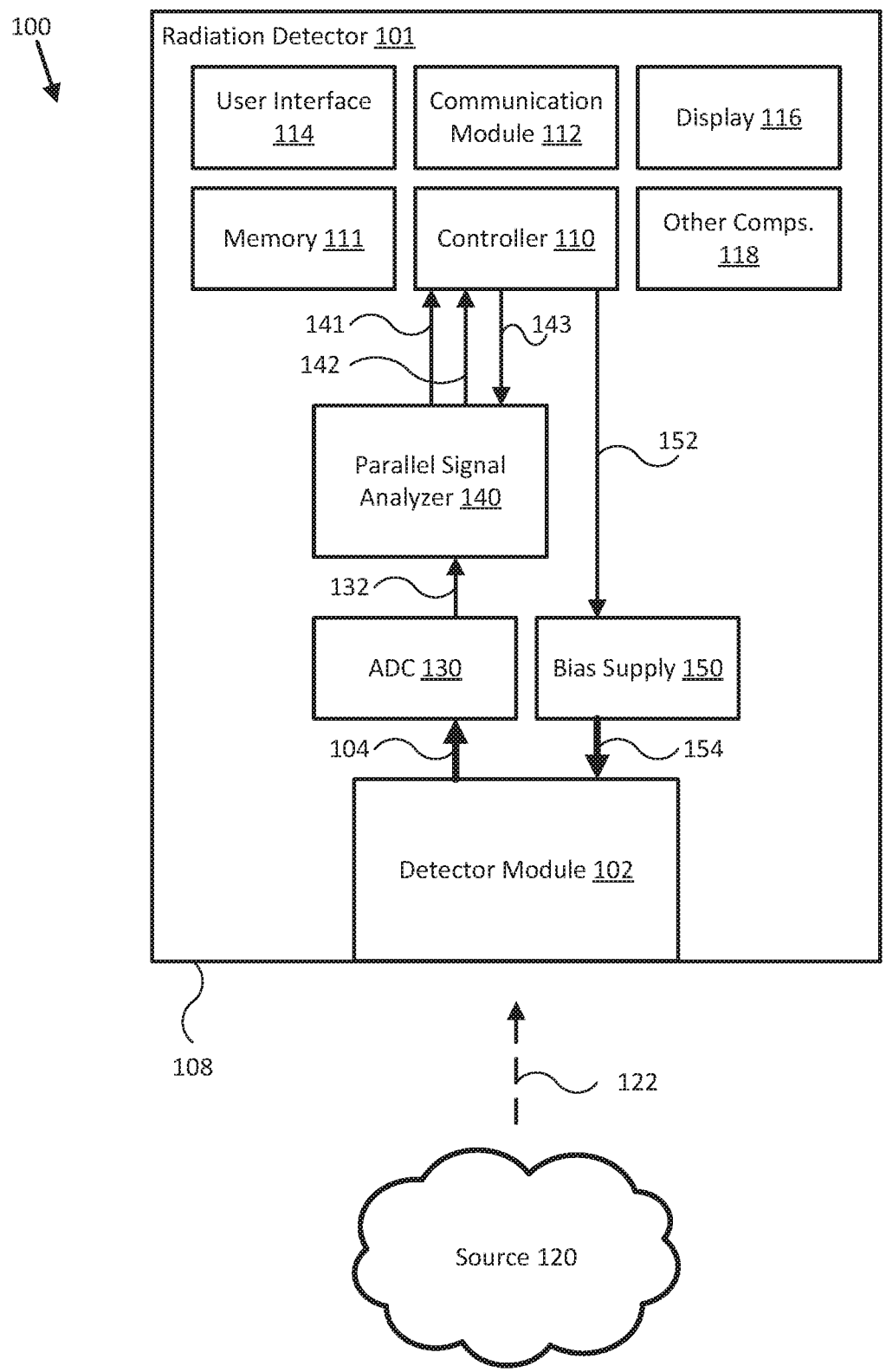
FIG. 1 illustrates a block diagram of a radiation detection system in accordance with an embodiment of the disclosure.

Embodiments of the present disclosure are able to provide substantially simultaneous and reliable spectroscopic and dose rate measurements in high radiation environments. Specifically, embodiments perform parallel spectroscopic and dose rate analysis on signals corresponding to radiation detection events. The spectroscopic analysis is performed according to a first measurement latency (e.g., a charge integration time and/or a pulse shaping time) that emphasizes accurate determination of the energies of radiation detection events, and the dose rate analysis is performed according to a second measurement latency that can be adjusted (e.g., based on the rate of radiation detection events) to emphasize throughput over accuracy and to reduce the effective dead time associated with the dose rate measurements. As a result, embodiments provide accurate and reliable spectroscopic and dose rate measurements in variable and/or high radiation environments, where the rate of radiation detection events would otherwise result in substantial instrumental dead time and either poor spectroscopic fidelity or inaccurate dose rate reporting. In some embodiments, the parallel processing allows dose rate measurements to be at least partially calibrated by coincident spectroscopic measurements, as described herein.

Radiation detectors measure the energy and count rate of radiation to identify radioactive isotopes and calculate dose rate. Personal radiation detectors (PRDs) and/or spectroscopic PRDs (SPRDs) are typically required to provide isotope identification and the present dose rate in all environments, including highly radioactive environments where the overall count rate of radiation detection events is relatively high. In general, radiation detectors employ a detector module to convert incident radiation to electrical pulses. The energy of the radiation detection events can be determined by integrating the charge of the pulses or shaping the pulses to a proper form for pulse-height measurement and comparing with calibration.

For each type of detector module (e.g., for each type of scintillator and/or scintillator/readout pair), there is an optimum charge integration or pulse shaping time corresponding to an optimum energy resolution for the resulting measurements (e.g., shorter times result in relatively poor energy resolution and/or measurement accuracy, and longer times do not appreciably increase the resolution or accuracy). The optimum analysis time (e.g., charge integration or pulse shaping time) is typically proportional to the pulse decay time, which is characteristic to the material used for the scintillator and the type or arrangement of photomultipliers used for the detector module. During the analysis, subsequent overlapping signals may be ignored until the analysis is complete, and ignored events result in instrumental dead time (e.g., the ratio of the rejected/ignored signals to the total number of received signals).

When the counting rate is low, such as in a low radioactive environment, a relatively long analysis time may be used to preserve optimum energy resolution without risk of substantial instrumental dead time. However, when encountering a highly radioactive source, using a long analysis time can result in substantial instrumental dead time, which is undesirable. Embodiments of the present disclosure can detect when the dead time or counting rate is higher than preset thresholds and dynamically decrease the analysis time so that the corresponding instrumental dead time is below the threshold. In various embodiments, a user may select the threshold to balance the potential impact of poorer energy resolution for isotope identification against prolonged measurements.

Embodiments of the present disclosure are intended to be implemented in radiation detectors generally, and more particularly in PRDs and SPRDs, which are typically portable. Typical elements of a radiation detector include a detector module, various electrical components, such as amplifiers, analog to digital converters (ADCs), and/or bias supplies, and various signal processing electronics. For example, in some embodiments, the energy of incident radiation may be obtained using signal processing implemented as circuitry and/or software residing in microprocessors, field programmable gate arrays (FPGAs), and/or other electronic devices to analyze the electronic pulses provided by a detector module.

In various embodiments, portable radiation detectors may include two general types of detector modules: scintillator (e.g., NaI, CsI, LaBr, CLYC) based detector modules and semiconductor (e.g., Ge, CdZnTe) based detector modules. When radiation strikes a scintillator, optical photons are generated, and the photons are converted to photoelectrons by photomultipliers such as photomultiplier tubes and/or silicon photomultipliers (SiPMs). In the case of semiconductor based detector modules, electron-hole pairs are generated by interaction of the semiconductor material with incident radiation, and the resulting signals can be analyzed using the same techniques used to analyze the signals produced by the photomultipliers. For example, the charges produced by the photomultiplier or semiconductor may form pulses that can be amplified by a pre-amplifier, digitized, and provided to signal analyzers.

The amplitudes of the pulses are a measure of the energy of the incident radiation, which can be used for isotope identification (e.g., by matching the energy and/or distribution of a measured energy spectrum to a known energy spectrum). In order to determine the energy of the incident radiation, signal analyzers may integrate the pulse over time to obtain the total charge, for example, or shape the pulse to a particular characteristic line shape (e.g., a Gaussian and/or other line shape, which may be intrinsic to the type of detector module used) for peak detection, both of which can be used to determine the energy of the measured event. Spectroscopy analysis may include calibration and/or stabilization of the measurement process, energy peak detection, noise reduction, source identification, and/or other spectroscopy analysis and/or processing configured to provide an energy spectrum of incident radiation, for example. Dose rate analysis may include similar spectroscopy analysis, for example, coupled with event counting, statistical estimations of absorption, and/or other dose rate analysis and/or processing configured to provide a measure of the energy imparted to matter by incident radiation.

FIG. 1 illustrates a block diagram of a radiation detection system 100 in accordance with an embodiment of the disclosure. As shown by the embodiment presented in FIG. 1, radiation detector 101 may include a variety of components adapted to detect ionizing radiation 122 produced by source 120 and report detections, spectroscopy measurements, and/or dose rate measurements to other devices or a user as described herein. For example, system 100 may report the detection of radiation by aggregating detection data to provide an accumulated dosage, spectrograph, or material identification of radiation detected by system 100, and then transmitting the radiation data to a display, such as display 116. In other embodiments, system 100 may report detections by energizing an LED indicator (e.g., user interface 114) and/or transmitting an alert or notification signal (e.g., using communication module 112) to a component (e.g., an alarm, or an electrical switch or relay) of a notification system.

In the embodiment shown in FIG. 1, radiation detector 101 includes detector module 102. Detector module 102 may be implemented with a variety of structures and materials adapted to interact with ionizing radiation 122 to produce electrical signals or pulses that may, in-turn, be analyzed (e.g., by ADC 130, parallel signal analyzer 140, and/or controller 110) to provide spectroscopy measurements, dose rate measurements, and/or other radiation data, as described herein. In general, detector module 102 may be configured to receive bias 154 and/or other control signals from bias supply 150, controller 110, and/or other elements of system 100, for example, and provide radiation detection event signals 104 to ADC 130, parallel signal analyzer 140, and/or controller 110.

In various embodiments, detector module 102 may be implemented with a scintillator sensor and photomultiplier and/or a semiconductor sensor configured to provide analog electrical signals (e.g., radiation detection event signals 104) corresponding to radiation detection events caused by ionizing radiation 122 interacting with the scintillator sensor and/or semiconductor sensor of detector module 102. As described more fully herein, detector module 102 may in some embodiments be implemented as a removable and/or replaceable cartridge or can configured to interface with housing 108 and/or other elements of radiation detector 101.

Each of controller 110, memory 111, user interface 114, communication module 112, display 116, other components 118, ADC 130, parallel signal analyzer 140, and/or bias supply 150, if optionally included in detector 101, may be coupled to a common PCB or to housing 108, for example, depending on a desired application and/or overall size of radiation detector 101. In other embodiments, any one or group of such components may be implemented externally to radiation detector 101, for example, and/or in a distributed or grouped manner (e.g., multiple controllers 110 operating radiation detector 101, or multiple radiation detectors 101 operated by a single controller 110).

In various embodiments, controller 110 may be implemented as any appropriate logic device (e.g., microcontroller, processor, application specific integrated circuit (ASIC), field programmable gate array (FPGA), or other logic device) that may be used by system 100 to execute appropriate instructions, such as software instructions and/or signal processing operations for detecting radiation using detector module 102. Further, controller 110 may be implemented with various signal processing devices, such as analog to digital converters (ADCs), trigger inputs, timing circuitry, and other signal processing devices as described herein.

In various embodiments, at least some portion or some functionality of controller 110 may be part of or implemented with other existing logic devices of separate systems, such as a server, a personal electronic device (e.g., a mobile phone, smartphone, tablet device, laptop computer, desktop computer), and/or any other device that may be used to process, report, or act on radiation detected by system 100. In other embodiments, controller 110 may be adapted to interface and communicate with various external logic devices and associated components and/or perform various operations in a distributed manner (e.g., using communications module 112).

In general, controller 110 may be adapted to interface and communicate with other components of system 100 to perform the methods and processes described herein. For example, controller 110 may be adapted to perform gross counting operations, spectrometry, and/or various stabilization/calibration methods, as described herein. In one embodiment, controller 110 may be adapted to use communication module 112 to report radiation detection to display 116 and display a dose amount or rate or an alert notification, for example, or display an image of a spectrographic map of source 120. In another embodiment, controller 110 may be adapted to use communication module 112 to establish a wired or wireless communication link with an external notification system, for example, and report counts, energies, transient characteristics, dose rates, and/or other characteristics of detected radiation.

ADC 130 may be implemented as any analog to digital converter and/or any appropriate logic device and/or analog circuitry configured to receive analog radiation detection event signals 104 from detector module 102 and provide digitized radiation detection event signals 132 to parallel signal analyzer 140.

Parallel signal analyzer 140 may be implemented as any analog and/or digital device and/or circuitry configured to receive radiation detection event signals 132 and analyze the signals at least two parallel analysis channels to provide spectroscopy output 141 and dose rate output 142 to controller 110. For example, in some embodiments, parallel signal analyzer 140 may be implemented by an FPGA with portions of the FPGA allocated to analyze radiation detection event signals 132 using a spectroscopy pulse analyzer, for example, and other portions of the FPGA allocated to analyze radiation detection event signals 132 using a does rate pulse analyzer, where a measurement time for the dose rate pulse analyzer and/or the spectroscopy pulse analyzer may be adjusted (e.g., by controller 110 using control signals 143) to adjust a corresponding instrumental dead time for one or both analyzers. In various embodiments, parallel signal analyzer 140 may be configured to perform such split, dual, or parallel analysis substantially simultaneously. In some embodiments, the simultaneous parallel analysis allows dose rate measurements to be at least partially or periodically calibrated by coincident spectroscopic measurements, as described herein.

Bias supply 150 may be implemented as any appropriate logic device and/or analog circuitry configured to receive bias control signal 152 from controller 110 and provide bias 154 to detector module 102. For example, bias supply 150 may be configured to generate and supply a bias voltage to detector module 102 to help detector module 102 provide responses substantially proportional to the energy of incident ionizing radiation 122. In various embodiments, bias supply 150 may also be configured to provide power and/or other signals and/or control signals (e.g., by controller 110) to detector module 102.

Although shown in FIG. 1 as separate, controller 110, ADC 130, parallel signal analyzer 140, and/or bias supply 150 may be partially or wholly integrated into one or more monolithic logic devices and/or analog components. In some embodiments, ADC 130 and/or bias supply 150 may be integrated with detector module 102 so as to reduce a risk of analog signal interference and/or noise injection into the measurement process.

Memory 111 is typically in communication with at least controller 110 and may include one or more memory devices (e.g., memory components) to store information, including radiation detection data, calibration data, other types of sensor data, and/or software instructions. For example, memory 111 may include an isotope identification library, which may be updated, adjusted, and/or otherwise managed by a user through interaction with user interface 114. Such memory devices may include various types of volatile and non-volatile information storage devices, such as RAM (Random Access Memory), ROM (Read-Only Memory), EEPROM (Electrically-Erasable Read-Only Memory), flash memory, a disk drive, and/or other types of memory. In one embodiment, memory 111 may include a portable memory device that can be removed from system 100 and used to convey stored data to other systems for further processing and inspection.

Communication module 112 may be configured to facilitate communication and interfacing between various components of system 100 (e.g., between controller 110 and memory 111 and/or display 116) and/or various external devices, such as a wireless access point, a personal electronic device, a server, and/or other detectors. For example, components such as user interface 114 and display 116 may transmit and receive data to and from controller 110 through communication module 112, which may be adapted to manage wired and/or wireless communication links between the various components. As such, communication module 112 may support various interfaces, protocols, and standards for local system networking, such as the controller area network (CAN) bus, the local interconnect network (LIN) bus, the media oriented systems transport (MOST) network, or the ISO 11738 (or ISO bus) standard.

In some embodiments, controller 110 may be adapted to communicate, via communication module 112, with a remote user interface, a notification system, or other detection systems to, for example, aggregate reports from multiple systems or sensors and/or implement a particular detection and/or notification method. As such, communication module 112 may include a wireless communication component (e.g., based on the IEEE 802.11 WiFi standards, the Bluetooth™ standard, the ZigBee™ standard, or other appropriate short range wireless communication standards), a wireless broadband component (e.g., based on WiMax technologies), a mobile cellular component, a wireless satellite component, or other appropriate wireless communication components. Communication module 112 may also be configured to interface with a wired network and/or device via a wired communication component, such as an Ethernet interface.

User interface 114 provides user interaction with detector 101 and may include one or more buttons, indicators (e.g., LEDs), keyboards, trackballs, knobs, joysticks, displays (e.g., a liquid crystal display, a touch-screen display), and/or other type of user interface adapted to accept user input and/or provide user feedback. In one embodiment, user interface 114 may include a power button, a vibration motor, an LED to indicate a radiation detection event (e.g., a count), and/or a speaker to provide an audible indication of a detection event (e.g., visible, tactile, and/or audible indicators) and/or a dose or dose rate. In various embodiments, user interface 114 may be used to input a variety of system configuration settings, such as stabilization/calibration parameters, as described herein. In some embodiments, user interface 114 may be used to view one or more reports, graphs, and/or other radiation detection data captured by system 100 and/or processed according to the various operations described herein.

Display 116 may be configured to present, indicate, or otherwise convey alerts, notifications, counts, dose rates, and/or other reports of radiation detection (e.g., generated by controller 110). Display 116 may be implemented with an electronic display screen, such as a liquid crystal display (LCD), a cathode ray tube (CRT), or various other types of generally known video displays and monitors, including touch-sensitive displays. Display 116 may be suitable for presenting radiation detection data, graphs, images, reports, or other information as described herein.

Other components 118 may include various stabilization/calibration devices such as a temperature sensor/probe (e.g., a thermocouple, an infrared thermometer), an LED or laser diode (e.g., to provide a known photon source), an ambient light sensor, a voltage regulator and/or filter, a variable voltage source, and/or other types of devices that can be used to facilitate stabilization or calibration, as described herein. Sensor data from such sensors may be utilized by controller 110 to detect stabilization/calibration parameters related to detector 101, and thereby produce more reliable reports of detecting radiation. In some embodiments, other components 118 may include a GPS, accelerometer, compass, and/or other orientation sensor capable of sensing a positions and/or orientation of detector 101. Other components 118 may additionally include a power module implemented as a battery, a power adapter, a charging circuit, a power interface, a power monitor, and/or other type of power supply providing a stationary or mobile power source. In some embodiments, the power module may be adapted to provide uninterruptible power and/or power conditioning to protect continued operation of detector 101. In various embodiments, other components 118 may include an interface to a removable or replaceable detector module 102.

Other components 118 may also include a shutter disposed over an end of detector module 102 and/or a variety of other electrical and/or electronic components coupled to and/or supported by housing 108. In some embodiments, a shutter may be implemented as a mechanical or removable radiation shield adapted to selectively block or substantially reduce one or more components of ionizing radiation 122. For example, a shutter may be implemented with a high-Z material capable of substantially blocking alpha, beta, and relatively low energy gamma radiation from entering detector module 102, but allowing neutron and/or high energy gamma radiation. In various embodiments, a shutter may be actuated (e.g., opened and/or closed) electronically by controller 110, for example. Such shutter may be coupled to/supported by housing 108, for example, and housing 108 may be adapted to provide similar or differentiated radiation shielding relative to the shutter. In some embodiments, a shutter and/or housing 108 may be implemented, at least in part, using lead and/or tungsten panels, foil, and/or other structures, as described herein. In some embodiments, housing 108 may be adapted to protect system 100 from environmental conditions associated with space or atmospheric flight, and/or other outdoor environmental conditions, such as stationary or articulated mounting on a terrestrial structure, for example. In other embodiments, housing 108 may be adapted for handheld use.

Figure 2:
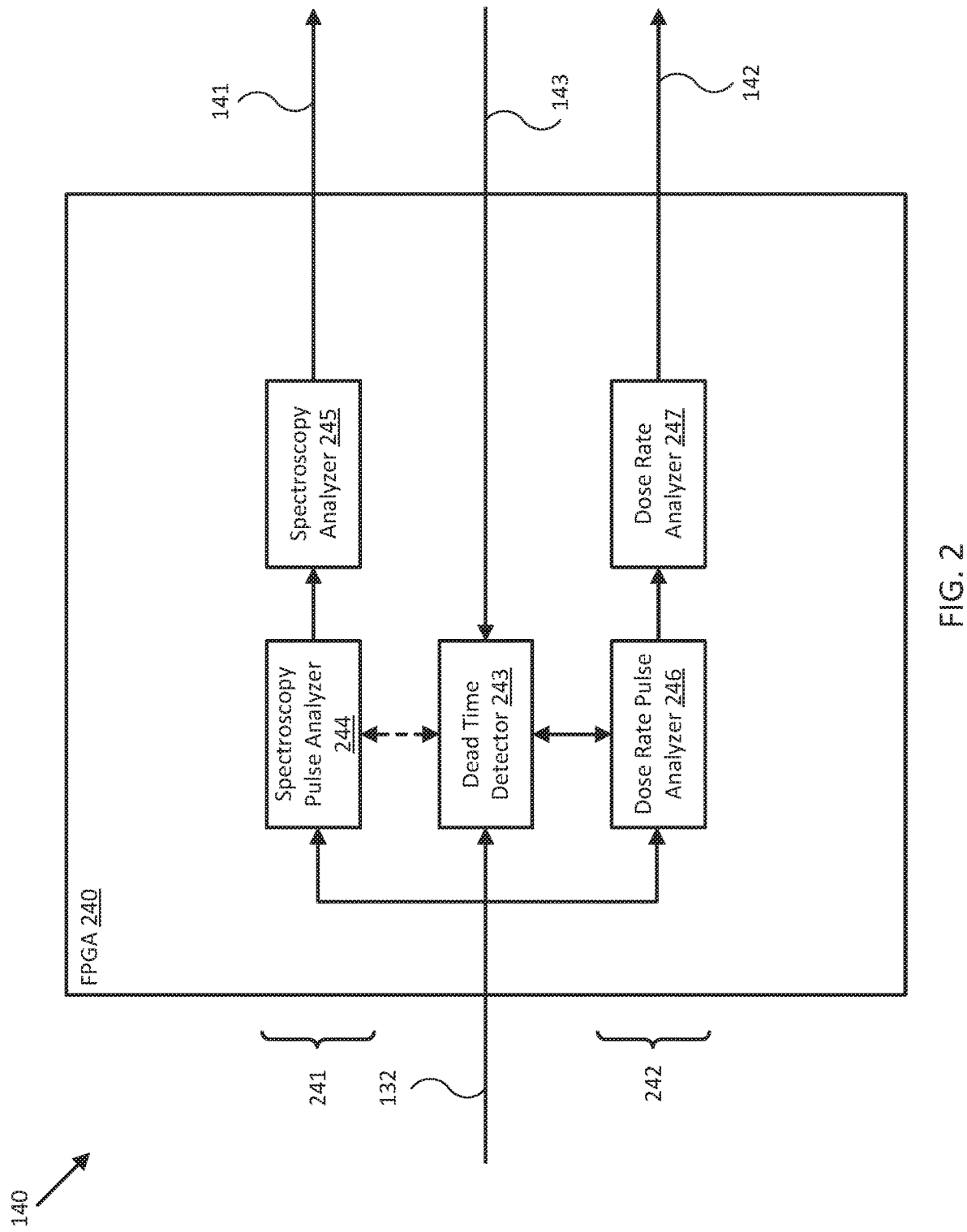
FIG. 2 illustrates a block diagram of a signal analyzer for a radiation detection system in accordance with an embodiment of the disclosure.

FIG. 2 illustrates a block diagram of parallel signal analyzer 140 for radiation detection system 100 in accordance with an embodiment of the disclosure. As shown in FIG. 2, parallel signal analyzer 140 may be implemented with FPGA 240, for example, and may include parallel analysis channels 241 and 242 configured to receive radiation detection event signals 132 and provide spectroscopy output 141 and dose rate output 142, as shown. Analysis channel 241 may correspond to a spectroscopy analysis channel, for example, and include spectroscopy pulse analyzer 244 and spectroscopy analyzer 245 optionally coupled to dead time detector 243. Analysis channel 242 may correspond to a dose rate analysis channel, for example, and include dose rate pulse analyzer 246 and dose rate analyzer 247 coupled to dead time detector 243.

Dead time detector 243 may be implemented as any digital and/or analog circuitry and/or software executed by FPGA 240 configured to detect and count the number of radiation detection events in radiation detection event signals 132 to determine a count rate for radiation detection event signals 132, compare that number to the analysis throughputs of dose rate pulse analyzer 246 and/or spectroscopy pulse analyzer 244 to determine corresponding instrumental dead times for dose rate pulse analyzer 246 and/or spectroscopy pulse analyzer 244, and provide measurement times to dose rate pulse analyzer 246 and/or spectroscopy pulse analyzer 244 based on the comparisons, the dead times, and/or one or more control signals 143 provided by controller 110. For example, in some embodiments, control signals 143 may include a threshold dead time or count rate, a measurement time adjustment, a selection of an analysis channel to adjust, and/or other control signals. In various embodiments, dead time detector 243 may be configured to dynamically provide a measurement time to either or both pulse analyzers 244 and 246 to reduce an instrumental dead time of pulse analyzer 244 and/or 246 below a threshold dead time.

Spectroscopy pulse analyzer 244 and/or dose rate pulse analyzer 246 may be implemented as integrators, pulse shape detectors, various filters and transforms (e.g., multipole filters), and/or any digital and/or analog circuitry and/or software executed by FPGA 240 configured to determine a characteristic of radiation detection event signals 132 corresponding to energies of radiation detection events. In various embodiments, dose rate pulse analyzer 246 (and, optionally, spectroscopy pulse analyzer 244) may be configured to determine the characteristic subject to a set measurement time provided and/or adjusted by dead time detector 243.

For example, pulse analyzers 244 and 246 may be implemented as integrators configured to integrate pulses of radiation detection event signals 132 for a set measurement time (e.g., provided by control signals 143 and/or dead time detector 243) to determine the energies of the pulses (e.g., the energies of radiation detection events corresponding to the pulses). Such set measurement time may be measured from a detected pulse peak, for example. In other embodiments, pulse analyzers 244 and 246 may be implemented as pulse shape detectors configured to compare and conform a characteristic line shape to each pulse (e.g., by varying a gain and/or other parameter of the line shape and minimizing the error between the line shape and the pulse), along a set measurement time, to determine the energies of the pulses.

In further embodiments, pulse analyzers 244 and 246 may be implemented as one or more filters and/or transforms that may be used to operate on the pulses and determine the energies of the pulses. For example, such filters may include one or more trapezoid filters, Gaussian shaping filters, asymmetric filters, and/or other filters and/or transforms that can be applied to pulses and used to shape the pulses, along a set measurement time, to facilitate measurement or recovery of peak amplitudes of the pulses and determine energies of the pulses. Such analysis may be referred to as multipole filtering (e.g., including one or more filters each characterized by one or more poles). In some embodiments, such processing may include one or more convolution filters configured to convolve each pulse with a known pulse shape, along a set measurement time, to determine the energies of the pulses.

In general, pulse analyzers 244 and 246 are configured to receive radiation detection event signals 132 and perform parallel analysis of radiation detection event signals 132 through relatively long measurement time analysis performed by spectroscopy pulse analyzer 244 of analysis channel 241 and relatively short measurement time analysis performed by dose rate pulse analyzer 246 of analysis channel 242. The long measurement time (e.g., slow) analysis integration yields high fidelity information that may be used for accurate high resolution and reliable spectroscopy. The short measurement time (e.g., fast) analysis favors throughput of completed measurements to achieve a higher effective dose rate range. Longer measurement times/analyses effectively collect more of the light emitted from the scintillator sensor and/or more of the signal emitted by the semiconductor sensor, where shorter measurement times/analyses effectively collect the bulk of the light/signals, but trade detection fidelity for throughput and a reduction in instrumental dead time.

Spectroscopy analyzer 245 may be implemented as any digital and/or analog circuitry and/or software executed by FPGA 240 configured to receive energies of radiation detection events from spectroscopy pulse analyzer 244 and provide spectroscopy output 141. Spectroscopy output 141 may include a spectrograph of radiation detection events, an isotope identification, calibrated and/or stabilized spectroscopy data, and/or other spectroscopy data associated with radiation detected by radiation system 100.

In some embodiments, spectroscopy analyzer 245 (and/or controller 110) may be configured to perform energy windowing on the energies provided by spectroscopy pulse analyzer 244 to, for example, filter selected energies and/or spectrums (e.g., of naturally occurring radioactive materials) out of spectroscopy output 141, thereby reducing nuisance alarms and/or improving operational sensitivity of spectroscopy output 141 and/or detection data provided or displayed by radiation detector 101.

Dose rate analyzer 247 may be implemented as any digital and/or analog circuitry and/or software executed by FPGA 240 configured to receive energies of radiation detection events from dose rate pulse analyzer 246 and provide dose rate output 142. Dose rate output 142 may include a cumulative and/or absorbed dose and/or dose rate, one or more aspects of spectroscopy output 141, and/or other dose rate data associated with radiation detected by radiation system 100.

Although parallel signal analyzer 140 in FIG. 2 shows first and second analysis channels 241 and 242, in other embodiments, parallel signal analyzer 140 may include three or more different parallel analysis channels, for example, where each parallel analysis channel may be configured to perform spectroscopy analysis, dose rate analysis, and/or other types of analysis, each according to a different measurement time (e.g., as set and/or controlled by their individual pulse analyzers, dead time detector 243, and/or controller 110).

Figure 3A:
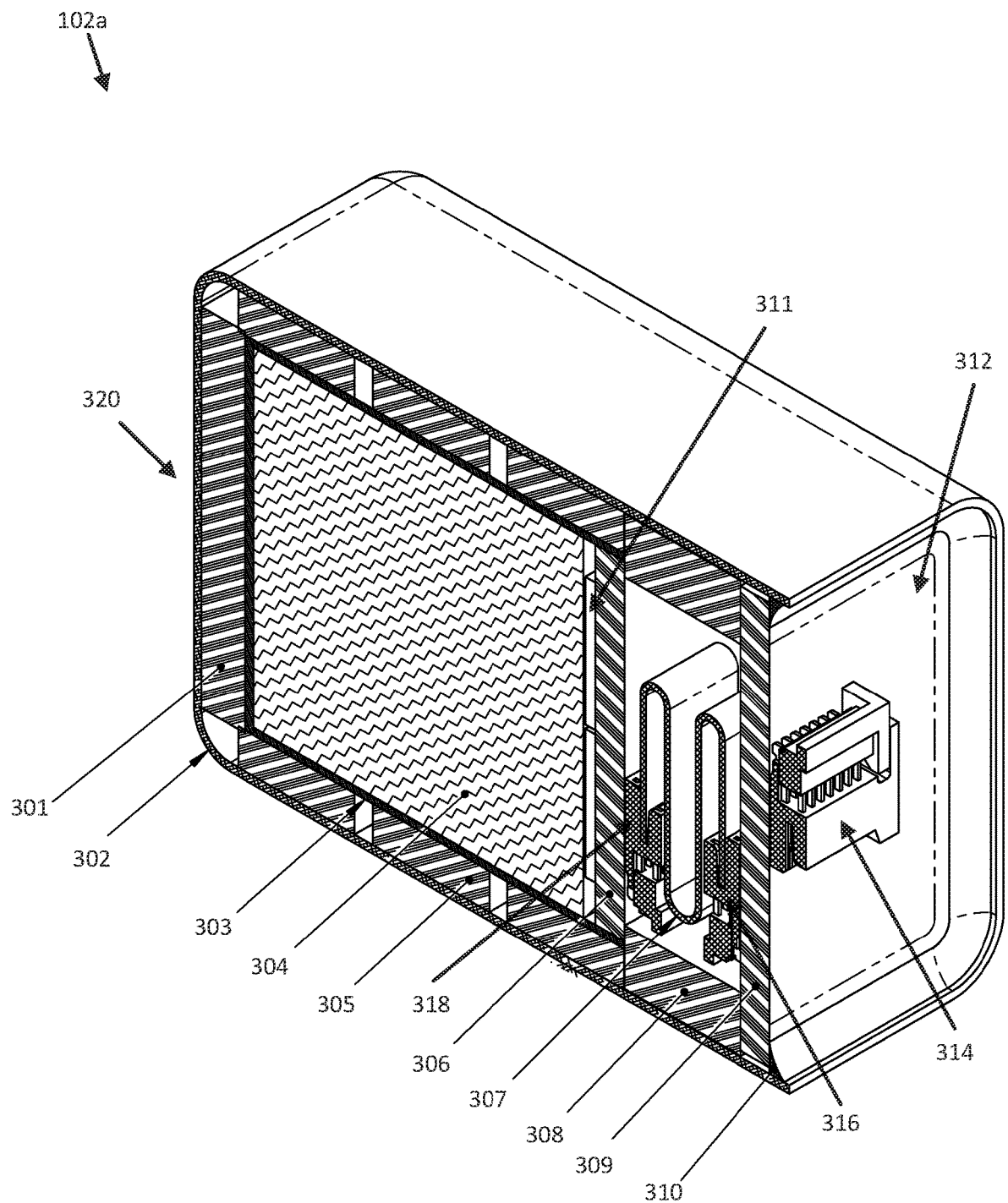
FIG. 3A illustrates a perspective cross sectional view of a detector module for a radiation detection system in accordance with an embodiment of the disclosure.

FIG. 3A illustrates a perspective cross sectional view of a detector module 102a for a radiation detection system in accordance with an embodiment of the disclosure. In particular, the embodiment shown in FIG. 3A provides a solution to the problem of hermetically sealing a hygroscopic material (e.g., a variety of different types of scintillator and/or semiconductor sensor materials) in a relatively inexpensive, easy to manufacture, ruggedized housing that omits conventional silicone sealants that otherwise outgas and degrade sensor materials, and that generally deteriorate over time.

In various embodiments, detector module 102a illustrates a system and method for ruggedized encapsulation of a radiation detector sensor that includes a hygroscopic material (e.g., where the sensor performance degrades as its water content increases). For example, as shown in FIG. 3A, detector module 102a includes a metal to printed circuit board (PCB) hermetic seal (e.g., generally shown as solder joint 310) that is formed by soldering a metal enclosure/housing 302 to an edge plated cap PCB 309 that includes a relatively large (e.g., broad and/or thick) ground plane 312 configured to facilitate formation of hermetic seal/solder joint 310 and to facilitate temperature equalization across the PCB and/or between the PCB and the metal enclosure.

Cap 309 may include various conductive vias, insulated from ground plane 312, that couple multi-conductor interfaces/connectors 314 and 316 on opposite sides of cap 309. A sensor 304 (e.g., a scintillator and/or semiconductor sensor) and coupled readout circuitry (e.g., SiPM 311 and/or readout PCB 306) may be held in place by damping inserts 301, 305, and 308 (e.g., foam, rubber, and/or other relatively low-durometer damping material pads or inserts), which may be configured to provide a thermal barrier to the enclosure and to provide shock absorption. In various embodiments, substantially all materials surrounding sensor 304 may be specified to have a low-Z value so as to minimize interference with the photon energy flux distribution of ionizing radiation incident on sensor 304. In other embodiments, portions of various elements of detector module 102a (e.g., portions of enclosure 302, damping inserts 301, 305, and 308, and/or other elements of detector module 102a) may be implemented with relatively high-Z value materials in order to spatially limit the radiation flux through sensor 304, such as forming and/or plating all but end surface 320 of enclosure 302 with a relatively high-Z material.

In one embodiment, detector module 102a may be implemented with a relatively small substantially cubic scintillation crystal (e.g., sensor 304) coupled to SiPM 311, where SiPM 311 is implemented as an array of photomultipliers or SiPM pixels mounted to readout PCB 306. Readout PCB 306 may not be hard-mounted to enclosure 302, and instead be separated from enclosure 302 by form-fit damping inserts 301, 305, and/or 308 that help bind the reflector 303 (e.g., polytetrafluoroethylene (PTFE) reflector tape, or Gore DRP™ reflector material) to sensor 304, bind sensor 304 to SiPM 311, and retain sensor 304 and readout PCB 306 in place within enclosure 302. In various embodiments, the lone electrical and physical connection between readout PCB 306 and cap 309/hermetic seal 310 is a flexible cable 307 that is configured to damp and/or block transmission of mechanical shock or thermal gradients.

In general, the internal assembly of detector module 102a is able to absorb relatively large mechanical shocks from multiple directions by relying on the compressive resistance of the damping inserts, which can be configured to fully cover the outer surfaces of sensor 304 and read PCB 306. As such, embodiments of the present disclosure provide substantially increased mechanical shock absorption as compared to conventional coil springs, which typically cannot be configured to utilize the same space and provide similar mechanical shock absorption. In some embodiments, one or more of the damping inserts can provide the increased mechanical shock absorption by covering and/or being disposed across more than half, 70%, 80%, and/or 90% the surface area of one or more surfaces of sensor 304. In general, such damping inserts (e.g., damping inserts 301, 305, and/or 308) may be formed from a relatively low durometer material, which can be defined as materials with a Shore A value approximately equal to or less than 40.

In the embodiment shown in FIG. 3A, hermetic seal 310 is implemented by edge plated cap 309, which includes external interface 314 and internal interface 316 on opposite sides, as shown. The edge plating of cap 309 allows cap 309 to be soldered directly to metallic enclosure 302. Cap 309 and/or metal enclosure 302 may be tin plated prior to assembly to facilitate formation of solder joint/hermetic seal 310. In various embodiments, cap 309 may include ground plane 312 (e.g., disposed within and/or on a surface of cap 309) that is connected to the plated edges of cap 309 and that can span substantially the entire planar extent of cap 309 (e.g., except for vias in cap 309 that allow electrical coupling of interfaces 314 and 316). In such embodiments, ground plane 312 may be configured to provide substantially equalized thermal expansion of cap 309 with hermetic seal 310 and enclosure 302, thereby enabling the detector to maintain a reliable hermetic seal over many more temperature cycles than conventional silicone to metal or glass hermetic seals.

Figure 3B:
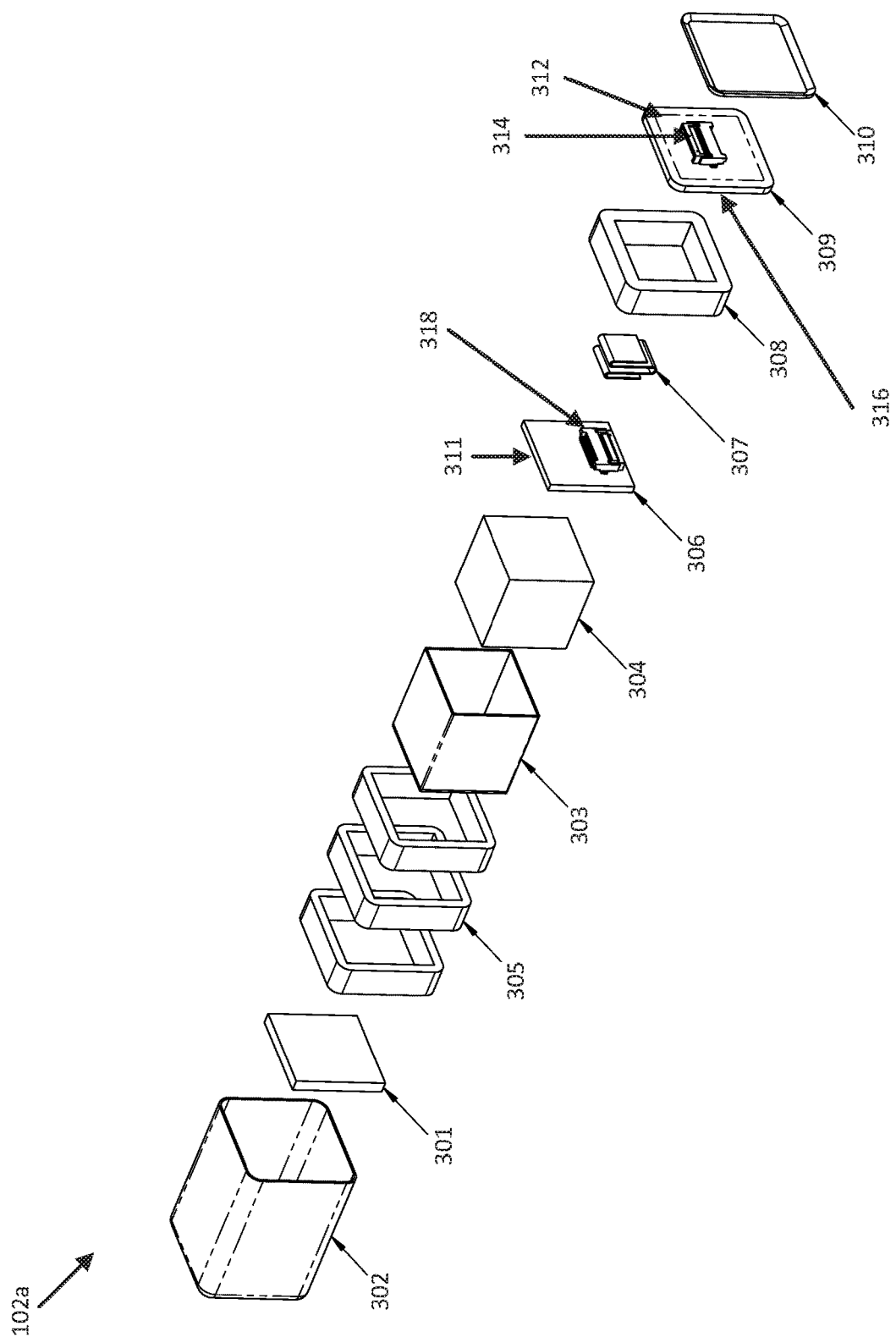
FIG. 3B illustrates an exploded view of a detector module for a radiation detection system in accordance with an embodiment of the disclosure.

FIG. 3B illustrates an exploded view of detector module 102a for a radiation detection system in accordance with an embodiment of the disclosure. As shown in FIGS. 3A and 3B, detector module 102a includes metal enclosure 302 hermetically sealed to cap 309 by solder joint 310. Inside the assembly, sensor 304 may be wrapped in reflector 303 and held in place with damping inserts (e.g., foam padding) 301 and 305. A silicon-based readout (e.g., SiPM 311) may be surface mounted on readout PCB 306 and held firmly in place and physically separate from cap 309 by damping inserts 305 and 308, as shown. SiPM 311 may be permanently mounted to sensor 304 with an optical adhesive. Sensor 304 and readout PCB 306 are not rigidly connected to any portion of metal enclosure 302, and instead rely on damping or foam inserts (e.g., damping inserts 301, 305, and 308) as a shock absorber capable of dispersing the kinetic energy of the assembly during a sudden mechanical shock. Flexible cable 307 connects readout PCB 306 and cap 309 and is configured to help physically isolate sensor 304 from mechanical shock and/or thermal gradients.

SiPM 311 may be implemented as any silicon-based pixelated semiconductor device adapted to convert photons (e.g., with wavelengths corresponding to those emitted by sensor/scintillator 304) entering pixels into per-pixel electrical signals corresponding to radiation detection events, as described herein. Readout PCB 306 may be a conventional printed circuit board, for example, and be adapted to provide electrical access to SiPM 311 (e.g., through various metal traces and/or readout interface 318) as well as physical support for SiPM 311 and/or readout interface 318. Interfaces 314, 316, and/or 318 may be implemented as relatively small (e.g., relative to a connector used to access a PMT) electrical interface adapted to support analog and/or digital coupling to readout PCB 306 and/or SiPM 311.

Optionally, detector module 102a may include a variety of components adapted to facilitate operation of and electrical access to SiPM 311. For example, detector module 102a may include an optical guide disposed between SiPM 311 and sensor 304 and/or reflector 303 to guide photons generated within sensor/scintillator 304 (e.g., scintillator photons) to an interfacing surface of SiPM 311. In various embodiments, the optical guide may be adapted to compensate for surface mismatch between sensor 304 and SiPM 311, and reflector 107 may be adapted to reflect photons towards SiPM 311.

In embodiments where sensor 304 is implemented as a scintillator, various scintillator materials may be used, such as NaI(Tl), CsI(Tl), LaBr$_3$(Ce), SrI$_2$(Eu), BGO, PVT, ZnS (Ag), Cs$_2$LiYCl$_6$:Ce (CLYC), CLLB, CLLBC, CeBr$_3$(Ce), any of the aluminum garnet scintillator types (e.g., YAG, LuAG, GAG, GYGAG, etc., which are referred to collectively as xAG), various alkali halides, $^6$LiI(Eu) (which may be embedded within an optical fiber), and/or other scintillator material. In embodiments where sensor 304 is implemented as a semiconductor sensor (e.g., an SiPM 311 is replaced with other non-optical readout electronics, such as low noise amplifiers and/or other readout electronics), various semiconductor materials may be used, such as CZT and/or TlBr. More generally, sensor 304 may be implemented with one or multiple materials, which may be sensitive to various different types of radiation, including gamma and neutron radiation. In further embodiments, sensor may be implemented with a gas proportional sensor and/or a Geiger-Muller counter/sensor.

Damping inserts 301, 305, and/or 308 may be formed from rubber, foam, aerogel, and/or other damping materials configured to provide physical shock absorption and/or thermal insulation between enclosure 302 and sensor 304, SiPM 311, and/or readout PCB 306. Readout PCB 306 may be formed from fiberglass and/or other relatively rigid material configured to physically support SiPM 311 and/or provide electrical interconnection between SiPM 311 and readout interface 318, which may be disposed on opposing sides of readout PCB 306. In various embodiments readout PCB 306 may be formed from material that is relatively resistant to degassing when thermally cycled. Flexible cable 307 may be a ribbon cable and/or other flexible cable configured to electrically couple interfaces 316 and 318 yet damp or block transmission of physical shock and/or thermal gradients to readout PCB 306. In various embodiments, flexible cable 307 may include multiple conductors and coaxial cables insulated from one another and configured to provide a low noise signal path for analog and/or digital signals (e.g., detector event signals, power signals, control signals) between interfaces 316 and 318.

In some embodiments, cap 309 may be formed from a rigid material similar to that used to form readout PCB 306. In other embodiments, cap 309 may be formed predominately from a plate of metallic material (e.g., similar to that used to form metal enclosure 302) with multiple coaxial vias (e.g., vias substantially filled with an insulating material and a center conductor insulated from the rest of cap 309 by the insulating material) configured to electrically couple external interface 314 to internal 316. In various embodiments, cap 309, interfaces 314 and 316, and/or corresponding vias, insulating materials, and/or conductive traces may be configured to help hermetically seal an internal portion of detector module 102a from the outer environment.

Figure 4A:
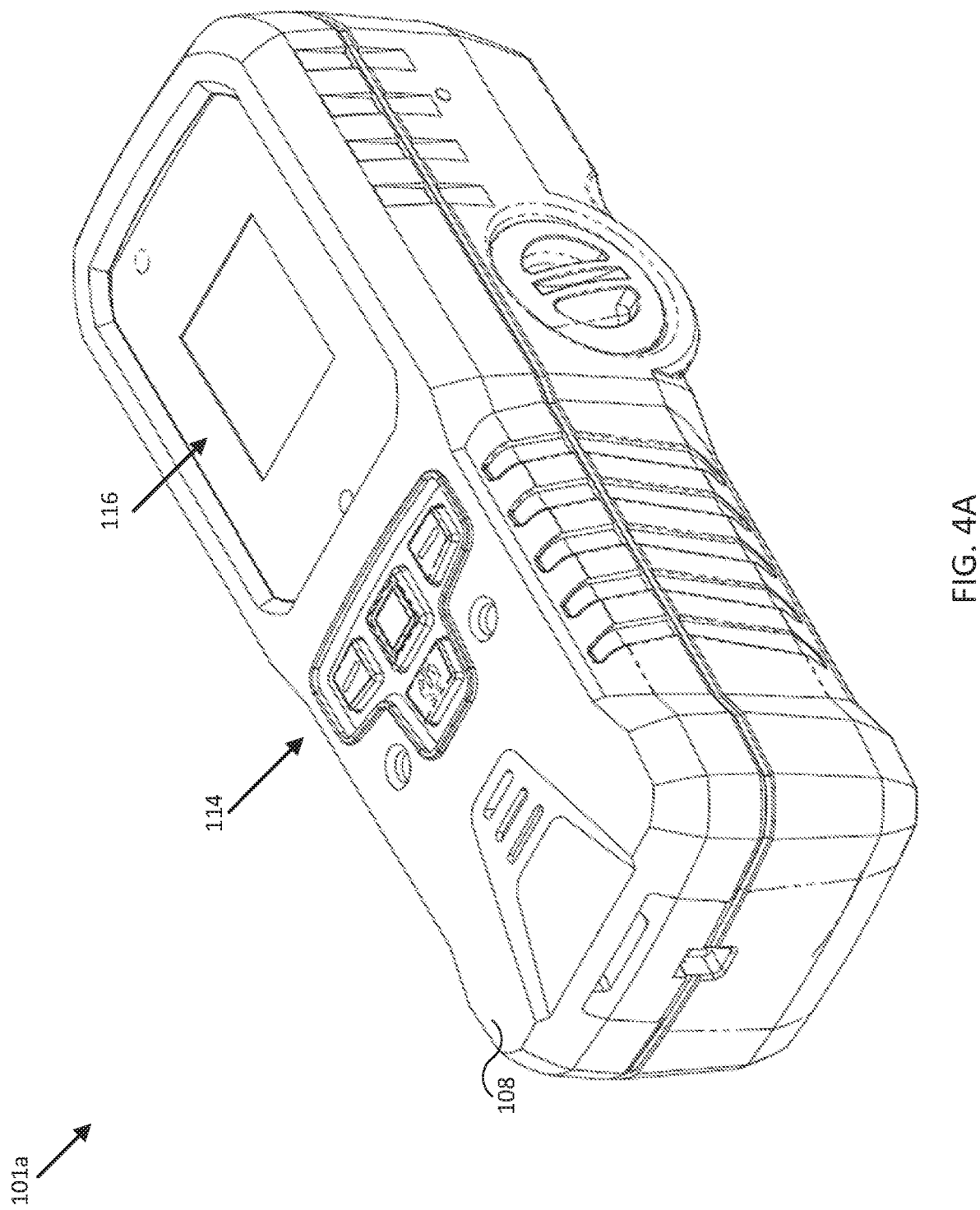
FIG. 4A illustrates a perspective view of a radiation detection system in accordance with an embodiment of the disclosure.
Figure 4B:
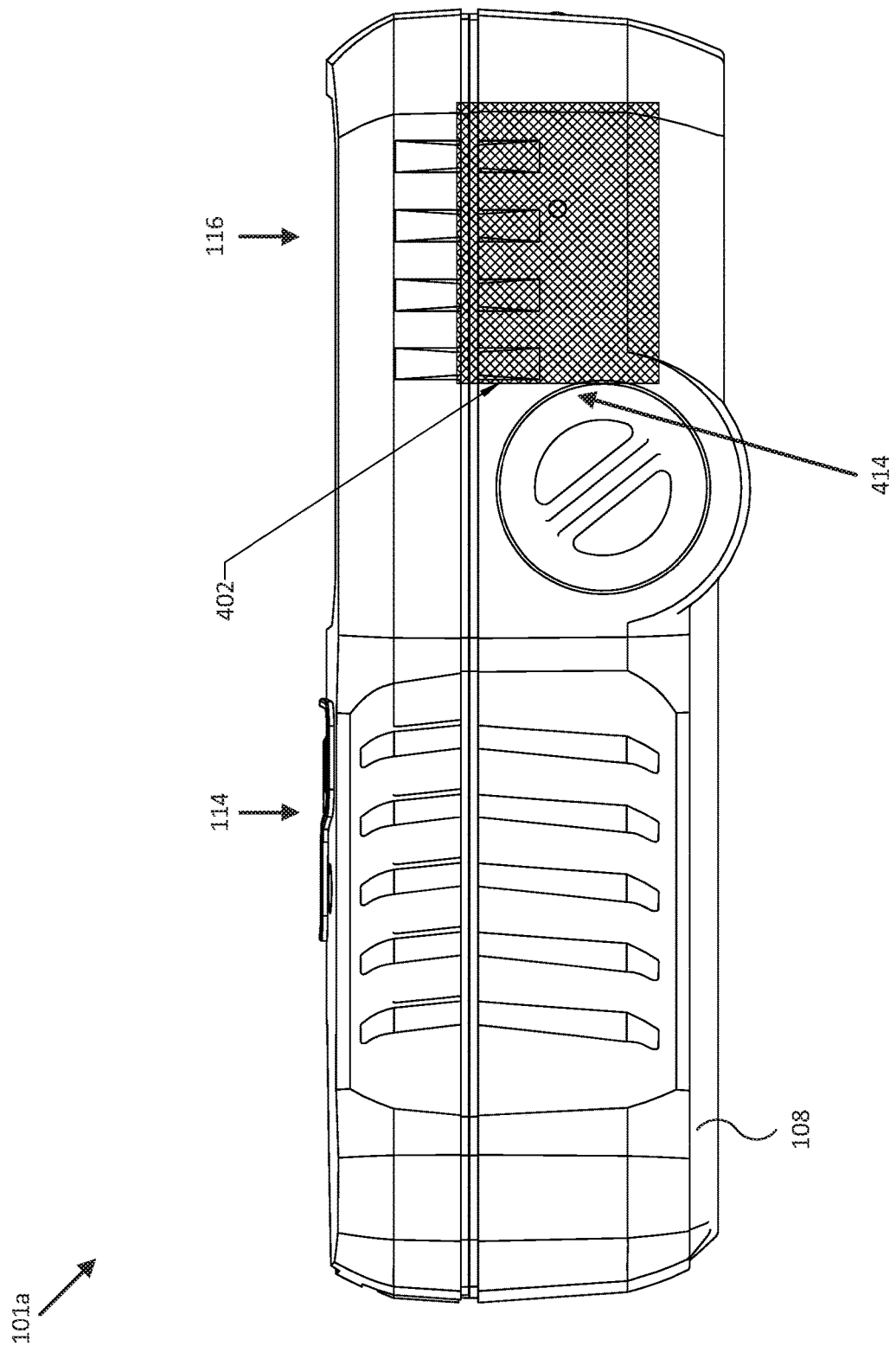
FIG. 4B illustrates a side view of a radiation detection system in accordance with an embodiment of the disclosure.

FIG. 4A illustrates a perspective view of a radiation detection system 101a in accordance with an embodiment of the disclosure. In particular, radiation detection system 101a may be implemented as a spectroscopic personal radiation detector (SPRD). In the embodiments shown in FIG. 4A, radiation detection system 101a includes rugged housing 108, user interface 114 (e.g., including various buttons), and display 116. FIG. 4B illustrates a side view of radiation detection system 101a in accordance with an embodiment of the disclosure. In FIG. 4B, hatched box 402 indicates a general placement of an embodiment of detector module 102a within radiation detection system 101a.

In various embodiments, detector module 102a may be removable and/or replaceable, for example, and be engaged/disengaged (e.g., using interface 314) with/from radiation detection system 101a by opening housing 108 and removing/inserting detector module 102a into recess 402 and engaging interface 314 with a corresponding interface within housing 108 (e.g., generally indicated as interface 414 of radiation detection system 101a). In some embodiments, detector module 102a may be engaged/disengaged with/from radiation detection system 101a by sliding detector module 102a into or out of a slot or recess formed in housing 108 and accessible without opening housing 108. As such, detector module 102a may be configured to physically and/or electrically couple to or within radiation detection system 101a using external interface 314 of detector module 102a and corresponding interface 414 of radiation detection system 101a. In some embodiments, interfaces 314 and 414 may form a male/female interface pair.

Figure 5:
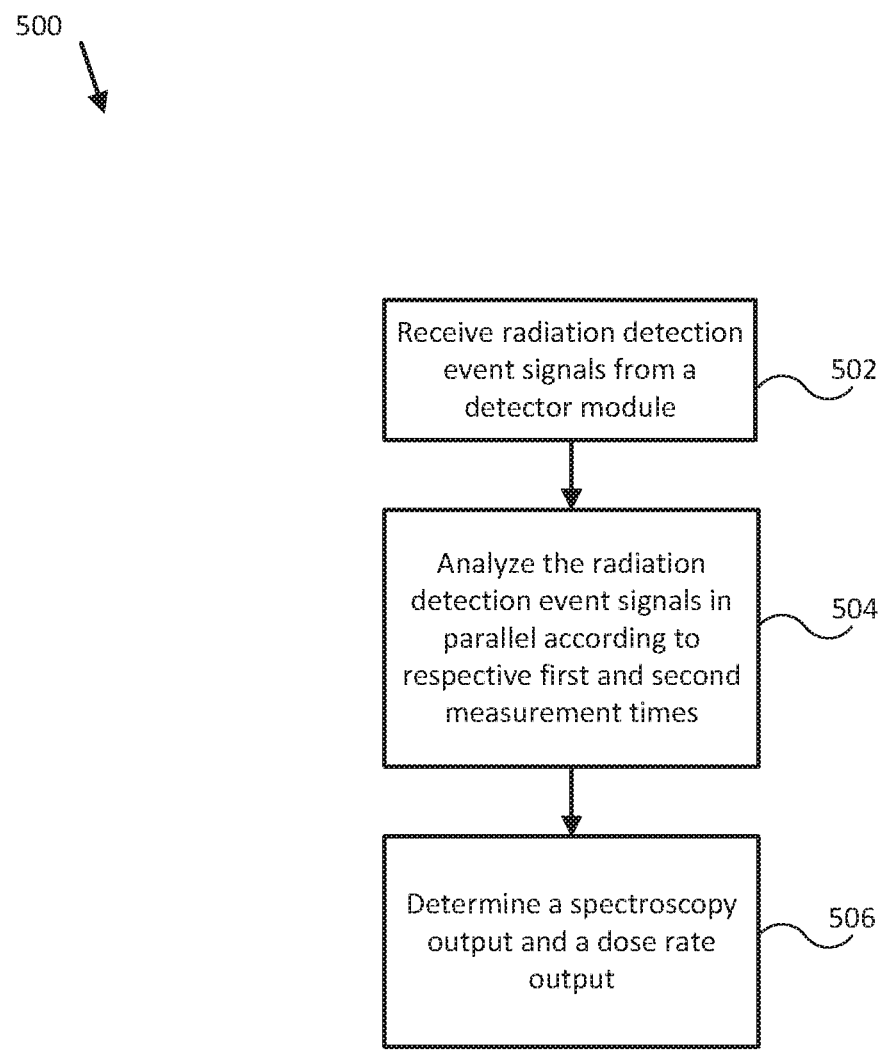
FIG. 5 illustrates a flow diagram of various operations to provide substantially simultaneous spectroscopy and dose rate outputs in accordance with an embodiment of the disclosure.

FIG. 5 illustrates a flow diagram of process 500 to provide spectroscopy data and/or dose rate data in accordance with an embodiment of the disclosure. In some embodiments, the operations of FIG. 5 may be implemented as software instructions executed by one or more logic devices used to implement a radiation detection system. More generally, the operations of FIG. 5 may be implemented with any combination of software instructions, electronic hardware (e.g., inductors, capacitors, amplifiers, or other analog and/or digital components), and/or mechanical hardware used with a radiation detection system. It should be appreciated that any step, sub-step, sub-process, or block of process 500 may be performed in an order or arrangement different from the embodiment illustrated by FIG. 5. Although process 500 is described with reference to system 100, process 500 may be performed according to systems different from system 100 and including a different selection and/or number of modules and/or components.

In block 502, radiation detection event signals from a detector module are received. For example, parallel signal analyzer 140 of system 100 may be configured to receive radiation detection event signals from detector module 102 that correspond to incident ionizing radiation in detector module 102. In some embodiments, parallel signal analyzer 140 may be adapted to receive radiation detection event signals from multiple different detector modules 102. In other embodiments, parallel signal analyzer 140 and/or controller 110 may be configured to determine a count rate and/or an instrumental dead time from the radiation detection event signals. In such embodiments, parallel signal analyzer 140 and/or controller 110 may be configured to compare the count rate and/or the instrumental dead time to a preset threshold (e.g., provided by a user through user interface 114) and adjust or decrease measurement times to reduce the instrumental dead time.

In block 504, radiation detection event signals are analyzed according to respective first and second measurement times. For example, parallel signal analyzer 140 may be configured to analyze the radiation detection event signals received in block 502 in parallel in first and second analysis channels 241 and 242 according to respective first and second measurement times. Such analysis may provide corresponding radiation detection event energies. In some embodiments, parallel signal analyzer 140 may be configured to analyze the radiation detection event signals according to three or more different measurement times, for example, to help select a particular measurement time or to help calibrate and/or stabilize operation of radiation detector 101.

In block 506, a spectroscopy output and a dose rate output are determined. For example, parallel signal analyzer 140 may be configured to determine a spectroscopy output and a dose rate output based on radiation detection event energies determined according to the respective first and second measurement times referenced in block 504. In some embodiments, where the second measurement time is smaller than the first measurement time (e.g., to reduce instrumental dead time of the second analysis channel), parallel signal analyzer 140 may be configured to detect radiation detection events that are analyzed by both the first and second analysis channels, coincidentally, and use the energy determined by the first analysis channel (e.g., the spectroscopy analysis channel) to calibrate or otherwise adjust the analysis performed by the second analysis channel (e.g., the dose rate analysis channel), which can in some cases compensate for a reduced measurement time for the second analysis channel.

By providing simultaneous spectroscopy and dose rate outputs, embodiments of the present disclosure offer a substantially faster, more reliable, and safer to use radiation detector, particularly in the context of highly radiative environments, where reliability and measurement speed are paramount.

Figure 6:
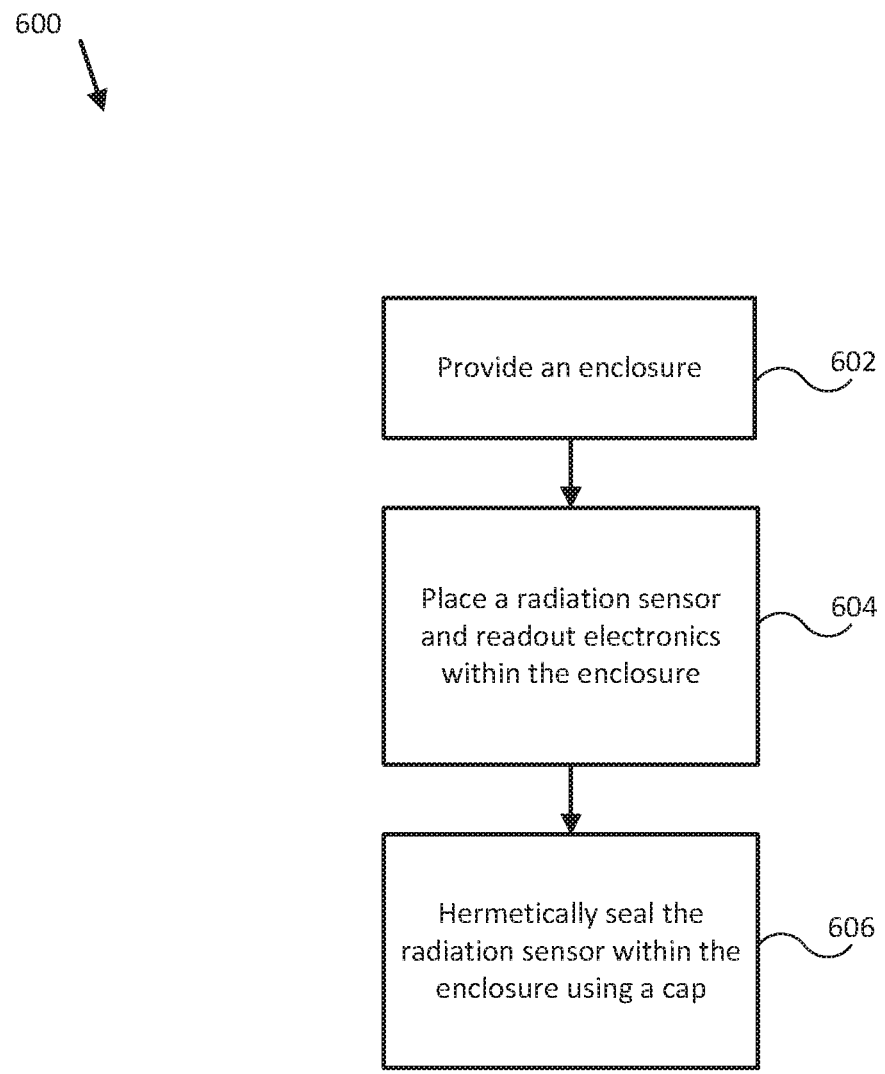
FIG. 6 illustrates a flow diagram of various operations to provide a radiation detector module in accordance with an embodiment of the disclosure.

FIG. 6 illustrates a flow diagram of process 600 to provide spectroscopy data and/or dose rate data in accordance with an embodiment of the disclosure. In some embodiments, the operations of FIG. 6 may be implemented as software instructions executed by one or more logic devices used to implement a radiation detection system. More generally, the operations of FIG. 6 may be implemented with any combination of software instructions, electronic hardware (e.g., inductors, capacitors, amplifiers, or other analog and/or digital components), and/or mechanical hardware used with a radiation detection system. It should be appreciated that any step, sub-step, sub-process, or block of process 600 may be performed in an order or arrangement different from the embodiment illustrated by FIG. 6. Although process 600 is described with reference to detector module 102, process 600 may be performed according to systems different from detector module 102 and including a different selection and/or number of modules and/or components.

In block 602, an enclosure is provided. For example, in some embodiments, a metalized and/or tin plated enclosure 302 may be provided to form an enclosure for detector module 102. In block 604, a radiation sensor and readout electronics are placed within the enclosure provided in block 602. For example, sensor 304 and SiPM 311 and readout PCB 306 may be placed within enclosure 302, where sensor 304 is separated from the enclosure by one or more of damping inserts 301, 305, and/or 308, and where SiPM 311 and/or readout PCB 306 are configured to provide radiation detection event signals 104/132 corresponding to incident ionizing radiation in the sensor 304. In block 606, a radiation sensor is sealed within the enclosure provided in block 602 using a cap. For example, sensor 304, SiPM 311, and/or readout PCB 306 may be hermetically sealed within enclosure 302 using cap 309 to form radiation detector module 102a, where cap 309 includes internal interface 316 configured to couple to readout PCB 306 and/or SiPM 311 and external interface 314 configured to couple to radiation detection system 101a.

By providing a well-insulated and metallically hermetically sealed detector module, embodiments of the present disclosure offer a substantially more rugged and cost effective detector module that can be used in extreme environments over a much longer product lifespan as compared to conventional detector modules.

Where applicable, various embodiments provided by the present disclosure can be implemented using hardware, software, or combinations of hardware and software. Also where applicable, the various hardware components and/or software components set forth herein can be combined into composite components comprising software, hardware, and/or both without departing from the spirit of the present disclosure. Where applicable, the various hardware components and/or software components set forth herein can be separated into sub-components comprising software, hardware, or both without departing from the spirit of the present disclosure. In addition, where applicable, it is contemplated that software components can be implemented as hardware components, and vice-versa.

Software in accordance with the present disclosure, such as non-transitory instructions, program code, and/or data, can be stored on one or more non-transitory machine readable mediums. It is also contemplated that software identified herein can be implemented using one or more general purpose or specific purpose computers and/or computer systems, networked and/or otherwise. Where applicable, the ordering of various steps described herein can be changed, combined into composite steps, and/or separated into sub-steps to provide features described herein.

Embodiments described above illustrate but do not limit the invention. It should also be understood that numerous modifications and variations are possible in accordance with the principles of the invention. Accordingly, the scope of the invention is defined only by the following claims.

What is claimed is:

1. A system comprising:
   a detector module for a radiation detector, wherein the detector module is configured to provide radiation detection event signals for a single radiation event corresponding to incident ionizing radiation; and
   a parallel signal analyzer configured to receive the radiation detection event signals and provide a spectroscopy output and a dose rate output, wherein the parallel signal analyzer is configured to:
   analyze the radiation detection event signals substantially simultaneously in parallel in first and second analysis channels according to respective first and second measurement times comprising charge integration time and/or pulse shaping time latencies for the single radiation event, wherein the first measurement time is associated with the first analysis channel and the spectroscopy output, and wherein the second measurement time is associated with the second analysis channel and the dose rate output and is different from the first measurement time; and determine the spectroscopy output and the dose rate output based on radiation detection event energies corresponding to the radiation detection event signals and determined according to the respective first and second measurement times.

2. The system of claim 1, wherein the parallel signal analyzer is configured to:
determine a count rate from the radiation detection event signals;
determine the count rate is above a preset threshold; and
decrease the first and/or second measurement time.

3. The system of claim 1, wherein the parallel signal analyzer is configured to:
determine an instrumental dead time associated with the first or second analysis channel based, at least in part, on a count rate of the radiation detection event signals and the respective first or second measurement time;
determine the instrumental dead time is above a preset threshold; and
decrease the first or second measurement time to lower the instrumental dead time to or below the preset threshold.

4. The system of claim 1, wherein:
the first analysis channel comprises a spectroscopy pulse analyzer;
the second analysis channel comprises a dose rate pulse analyzer; and
the spectroscopy pulse analyzer and/or the dose rate pulse analyzer comprises an integrator, a pulse shape detector, and/or a multipole filter configured to analyze individual pulses within the radiation detection event signals to determine energies of radiation detection events corresponding to the individual pulses.

5. The system of claim 4, wherein:
the integrator is configured to integrate the individual pulses for the corresponding first or second measurement time to determine the energies;
the pulse shape detector is configured to compare a characteristic line shape to a line shape of each individual pulse, along the corresponding first or second measurement time, to determine the energies; and
the multipole filter is configured to filter and/or shape the pulses, along the corresponding first or second measurement time, to determine the energies.

6. The system of claim 1, wherein:
the second measurement time is less than the first measurement time; and
the parallel signal analyzer is configured to use at least a portion of the spectroscopy output to calibrate the dose rate output, wherein the dose rate output comprises a cumulative or absorbed dose or dose rate configured to provide a measure of the energy imparted to matter by the incident ionizing radiation.

7. The system of claim 1, wherein:
the second measurement time is configured to reduce an instrumental dead time of the second analysis channel.

8. The system of claim 1, wherein:
the parallel signal analyzer comprises one or more field programmable gate arrays.

9. The system of claim 1, further comprising a logic device, a memory, and a display, wherein the logic device is configured to:

compare the spectroscopy output to an identification library stored in the memory to identify a source of the incident ionizing radiation;
perform energy windowing on the spectroscopy output to filter selected energies and/or spectrums out of the spectroscopy output; and
display the identified source and/or at least a portion of the spectroscopy output and/or the dose rate output using the display.

10. The system of claim 9, further comprising the radiation detector, wherein:
the radiation detector comprises a personal radiation detector or a spectroscopic personal radiation detector.

11. The system of claim 1, wherein:
the detector module comprises one or more of a scintillator sensor, a semiconductor sensor, a gas proportional sensor, and a Geiger-Muller counter and is configured to detect gamma radiation and/or neutron radiation; and
the system is configured to provide and analyze additional radiation detection event signals for additional radiation events following the single radiation event.

12. A method comprising:
receiving radiation detection event signals for a single radiation event corresponding to incident ionizing radiation from a detector module for a radiation detector;
analyzing the radiation detection event signals substantially simultaneously in parallel in first and second analysis channels according to respective first and second measurement times comprising charge integration time and/or pulse shaping time latencies for the single radiation event, wherein the first measurement time is associated with the first analysis channel and the spectroscopy output, and wherein the second measurement time is associated with the second analysis channel and the dose rate output and is different from the first measurement time; and
determining a spectroscopy output and a dose rate output based on radiation detection event energies corresponding to the radiation detection event signals and determined according to the respective first and second measurement times.

13. The method of claim 12, further comprising:
determining a count rate from the radiation detection event signals;
determining the count rate is above a preset threshold; and
decreasing the first and/or second measurement time.

14. The method of claim 12, further comprising:
determining an instrumental dead time associated with the first or second analysis channel based, at least in part, on a count rate of the radiation detection event signals and the respective first or second measurement time;
determining the instrumental dead time is above a preset threshold; and
decreasing the first or second measurement time to lower the instrumental dead time to or below the preset threshold.

15. The method of claim 12, further comprising:
analyzing individual pulses within the radiation detection event signals to determine energies of radiation detection events corresponding to the individual pulses.

16. The method of claim 15, wherein the analyzing individual pulses comprises:
integrating the individual pulses for the corresponding first or second measurement time to determine the energies;

comparing a characteristic line shape to a line shape of each individual pulse, along the corresponding first or second measurement time, to determine the energies; and/or filtering and/or shaping the pulses, along the corresponding first or second measurement time, to determine the energies.

17. The method of claim 12, wherein:

the second measurement time is less than the first measurement time; and the method comprises using at least a portion of the spectroscopy output to calibrate the dose rate output.

18. The method of claim 12, wherein:

the second measurement time is configured to reduce an instrumental dead time of the second analysis channel.

19. The method of claim 12, further comprising:

comparing the spectroscopy output to an identification library stored in a memory to identify a source of the incident ionizing radiation;

performing energy windowing on the spectroscopy output to filter selected energies and/or spectrums out of the spectroscopy output; and displaying the identified source and/or at least a portion of the spectroscopy output and/or the dose rate output using a display.

20. The method of claim 12, wherein:

the radiation detector comprises a personal radiation detector or a spectroscopic personal radiation detector;

the detector module comprises one or more of a scintillator sensor, a semiconductor sensor, a gas proportional sensor, and a Geiger-Muller counter and is configured to detect gamma radiation and/or neutron radiation; and the method further comprises repeating the receiving, the analyzing, and the determining for additional radiation events following the single radiation event.

* * * * *